(12) United States Patent
Jeong (10) Patent No.: US 7,471,108 B2
(45) Date of Patent: Dec. 30, 2008

(54) VARIABLE REFERENCE LEVEL INPUT CIRCUIT AND METHOD

(75) Inventor: In-Chul Jeong, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 330 days.

(21) Appl. No.: 11/298,201

(22) Filed: Dec. 8, 2005

(65) Prior Publication Data

US 2006/0125523 A1 Jun. 15, 2006

(30) Foreign Application Priority Data

Dec. 9, 2004 (KR) ........................ 10-2004-0103800

(51) Int. Cl.
*H03K 19/0175* (2006.01)
*H03K 19/003* (2006.01)

(52) U.S. Cl. .......................................... 326/83; 326/29

(58) Field of Classification Search .............. 326/82–87
See application file for complete search history.

(56) References Cited

U.S. PATENT DOCUMENTS

| 4,157,509 A | | 6/1979 | Zielinski | |
|---|---|---|---|---|
| 4,255,707 A | * | 3/1981 | Miller | ........................ 324/142 |
| 4,775,808 A | * | 10/1988 | Trumpp | ........................ 326/34 |
| 6,025,747 A | * | 2/2000 | Okayasu et al. | ........................ 327/407 |
| 6,614,296 B2 | | 9/2003 | Casper | |
| 6,617,918 B2 | | 9/2003 | Casper | |
| 6,653,893 B2 | | 11/2003 | Casper et al. | |
| 2002/0033715 A1 | | 3/2002 | Maeda | |
| 2003/0085737 A1 | * | 5/2003 | Tinsley et al. | ................. 326/86 |

FOREIGN PATENT DOCUMENTS

| JP | 06-021798 | 1/1994 |
|---|---|---|
| JP | 10-020973 | 1/1998 |
| KR | 2003-0066016 | 8/2003 |

OTHER PUBLICATIONS

English language abstract of Korean Publication No. 2003-0066016.
English language abstract of Japanese Publication No. 06-021798.
English language abstract of Japanese Publication No. 10-020973.

* cited by examiner

*Primary Examiner*—James H Cho
(74) *Attorney, Agent, or Firm*—Marger Johnson & McCollom, P.C.

(57) ABSTRACT

We describe an input circuit and method. The input circuit includes a variable reference level generator that increases a level of a reference signal in proportion to a time when an input signal transits from a low level to a high level and decreases the level of the reference signal in proportion to a time when the input signal transits from a high level to a low level. An analyzer compares the level of the input signal with the level of the reference signal, determines the level of the input signal, and outputs a signal based on the comparison. The input circuit and method widen the minimum difference between the input and reference signal to facilitate analysis of the input signal.

17 Claims, 7 Drawing Sheets

VARIABLE REFERENCE LEVEL INPUT CIRCUIT AND METHOD

PRIORITY CLAIM

This application claims priority from Korean Patent Application No. 10-2004-0103800, filed Dec. 9, 2004, which we incorporate by reference.

BACKGROUND

1. Field

The present invention relates to an input circuit and method and, more particularly, to an input circuit with a variable reference level generator that varies a reference signal level responsive to an input signal and an associated method.

2. Related Art

An input circuit determines a signal level of an externally provided input signal. Typically, the input circuit compares the reference signal level with the input signal level to determine whether the input signal level is higher or lower than the reference signal level.

Often, the input signal is distorted by the signal line through which it is input, and this distortion increases as the semiconductor device's operation speed increases. The faster the semiconductor device operates, i.e., the higher the frequency of the input signal, the farther from full swing the input signal deviates, and thus the poorer the quality of the input signal.

Figure 1A:
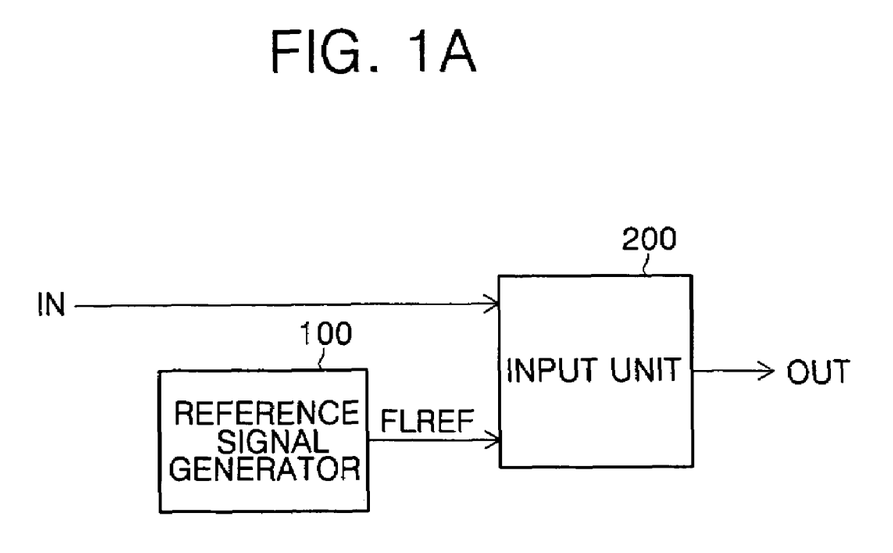
FIGS. 1A and 1B are block diagrams of an input circuit.
Figure 1B:
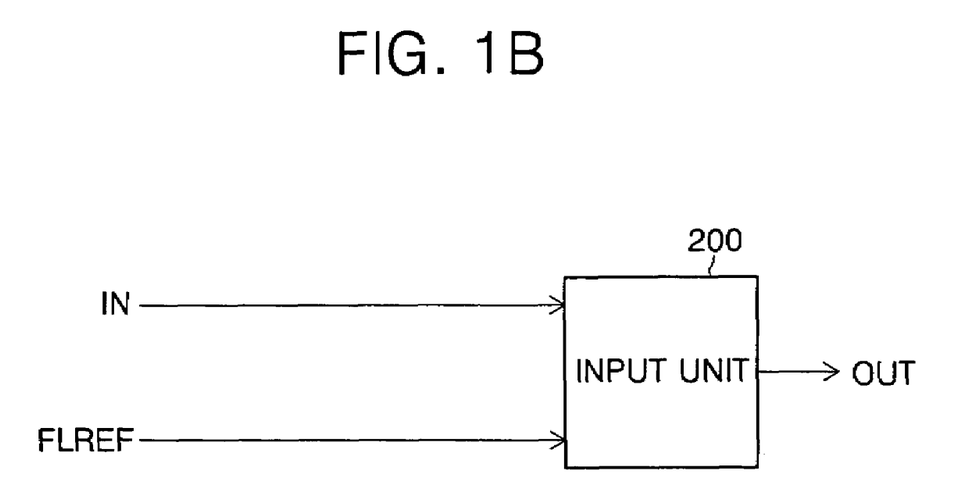

FIGS. 1A and 1B are block diagrams of a conventional input circuit. FIG. 1A shows a case where the input circuit determines the input signal level using an internally generated reference level. FIG. 1B shows a case where the input circuit determines the input signal level using an externally generated reference level.

The circuits shown in FIGS. 1A and 1B operate as follows.

In FIG. 1A, a reference level generator 100 outputs a reference signal FLREF with a fixed reference level. In FIGS. 1A and 1B, an input unit 200 compares the fixed level reference signal FLREF (FIG. 1A), or an externally generated fixed level reference signal FLREF (FIG. 1B), with an externally input signal IN, determines whether the input signal IN is at a logic low or high level, and outputs an output signal OUT based on the result.

Figure 2A:
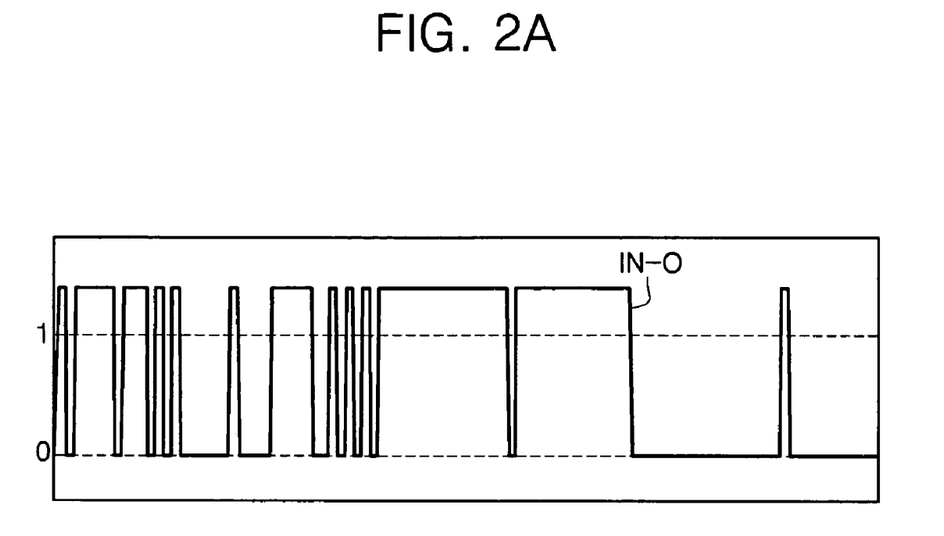
FIGS. 2A and 2B are signal waveform diagrams illustrating the operation of the input circuits shown in FIGS. 1A and 1B.
Figure 2B:
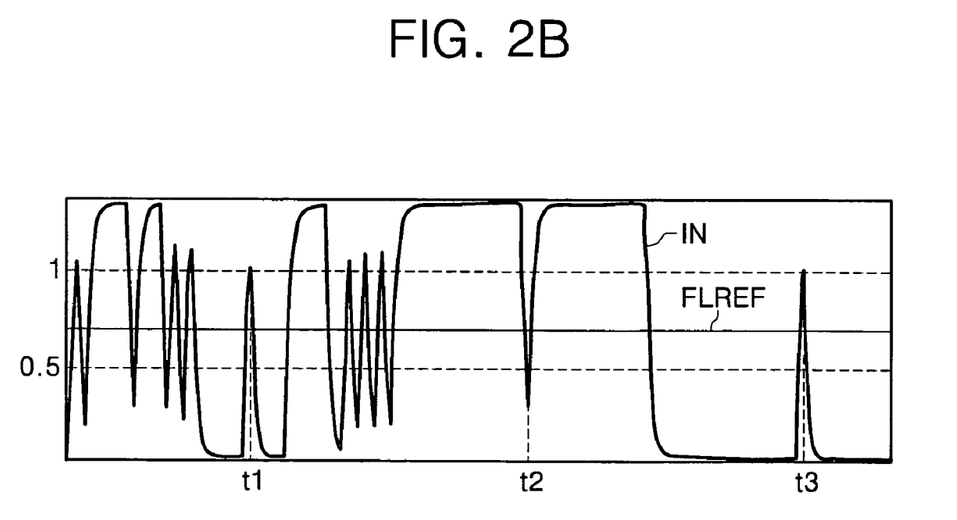

FIGS. 2A and 2B are signal waveform diagrams illustrating the operation of the input circuits shown in FIGS. 1A and 1B. FIG. 2A is a waveform diagram of an original input signal IN-O. FIG. 2B is a waveform diagram of an input signal IN seen from the input unit 200. In FIG. 2B, the fixed reference signal is denoted FLREF.

As the frequency of the original input signal IN-O increases, loading effect of the signal line increases and thus the input signal becomes incapable of a full swing. The input signal IN observed from the input unit 200 appears as a distorted version of the original input signal IN-O, as shown in FIG. 2B.

And the level of the reference signal FLREF is fixed as shown in FIG. 2B. The reference signal FLREF may be generated by the internal reference level generator 100 and input to the input unit 200 or applied externally to the input unit 200.

The input unit 200 compares the level of the reference signal FLREF with the level of the input signal IN and determines whether the input signal IN is at a logic low or high level.

In a typical input circuit, since the level of the reference signal FLREF is fixed, when a short pulse is generated in the original input signal IN-O, it is difficult to determine whether the input signal IN is at a logic high or low level.

Specifically, as shown in FIG. 2B, when the input signal IN is maintained at a low level (or a high level) for a predetermined time interval and then instantaneously changed to a high level (or a low level) at t1, t2, and t3, a difference in level between the input signal IN and the reference signal FLREF is remarkably smaller than at other times.

Put differently, when the original input signal IN-O is maintained at a low level (or a high level) for a predetermined time interval, the input signal IN has a level almost equal to the low level (or the high level) at which the original input signal IN-O is maintained. When the original input signal IN-O makes a low-to-high (or high-to-low) transition, the input signal IN cannot reach a sufficiently higher level (or a sufficiently lower level) than the level of the reference signal FLREF at a time where the input unit 200 determines the level of the input signal IN. As a result, a difference in level between the input signal IN and the reference signal FLREF is reduced.

In a typical input circuit, the level of the reference signal FLREF is fixed so that it is very difficult to normally determine the level of the input signal IN in the above-described worst case.

SUMMARY

We describe an input circuit comprising a variable reference level generator to generate a variable reference signal proportional to a transition time of an input signal changing from one level to another. An analyzer determines a level of the input signal by comparing the variable reference signal to the input signal and to generate an output signal responsive to the determination.

The variable reference level generator may include a converter to generate the variable reference signal responsive to the input signal and a limiter to limit a level swing of the variable reference signal to a predetermined range.

The converter may include a filter to filter the input signal.

The converter may include a resistor to receive the input signal at one end and a capacitor coupled between another end of the resistor and a voltage source.

The converter may include a resistor to receive the input signal at one end, a first capacitor coupled between another end of the resistor and a first voltage source, and a second capacitor coupled between the another end of the resistor and a second voltage source.

The limiter may include a high level limiting unit to limit a high level of the variable voltage reference signal by consuming current when a level of the variable voltage reference signal rises above a predetermined maximum value and a low level limiting unit to limit a low level of the variable voltage reference signal by supplying current when the level of the variable voltage reference signal drops below a predetermined minimum value.

The high level limiting unit may include an NMOS transistor coupled to a low voltage power supply and a gate to receive the variable voltage reference signal.

The low level limiting unit may include a PMOS transistor coupled to a high voltage power supply and a gate to receive the variable voltage reference signal.

The limiter may include a first resistor adapted to be coupled to a high voltage power supply at a first end and a second resistor adapted to be coupled to a second end of the first resistor and to a low voltage power supply at a third end.

The analyzer may be a voltage sense amplifier adapted to sense a voltage difference between the input signal and the variable voltage reference signal, to amplify the voltage difference, and to output the output signal.

The analyzer may be a current sense amplifier adapted to sense a current difference between the input signal and the variable voltage reference signal, to amplify the current difference, and to output the output signal.

We describe a method comprising generating a variable voltage reference signal, comparing an input signal with the variable voltage reference signal, and generating an output signal responsive to the comparing.

Generating may include increasing a level of the variable voltage reference signal in proportion to a time when an input signal transits from a low level to a high level and decreasing the level of the variable voltage reference signal in proportion to another time when the input signal transits from a high level to a low level.

Comparing may include comparing a level of the input signal with the level of the variable voltage reference signal.

Generating may include varying the level of the reference signal according to the input signal and limiting the level of the reference signal to within a predetermined range.

Limiting may include consuming current to limit a highest level of the reference signal when the level of the reference signal rises above a predetermined maximum value and supplying current to limit a lowest level of the reference signal when the level of the reference signal drops below a predetermined minimum value.

Comparing may include determining the level of the input signal by sensing a voltage difference between the variable voltage reference signal and the input signal.

Comparing may include determining the level of the input signal by sensing a current difference between the reference signal and the input signal.

We describe an input circuit comprising a converter to generate a variable reference signal responsive to an input signal, a limiter to limit a level swing of the variable reference signal, and an output circuit to generate an output signal responsive to the input signal and the variable voltage reference signal.

The converter may include a resistor coupled to a capacitor.

The limiter may include a PMOS transistor connected to a high voltage power supply and an NMOS transistor connected to a low voltage power supply and to the PMOS transistor.

The limiter may include two serially connected resistors.

The output circuit may include a voltage sense amplifier.

The output circuit may include a current sense amplifier.

DETAILED DESCRIPTION

We will describe embodiments of an input circuit and method with reference to the accompanying drawings.

Figure 3:
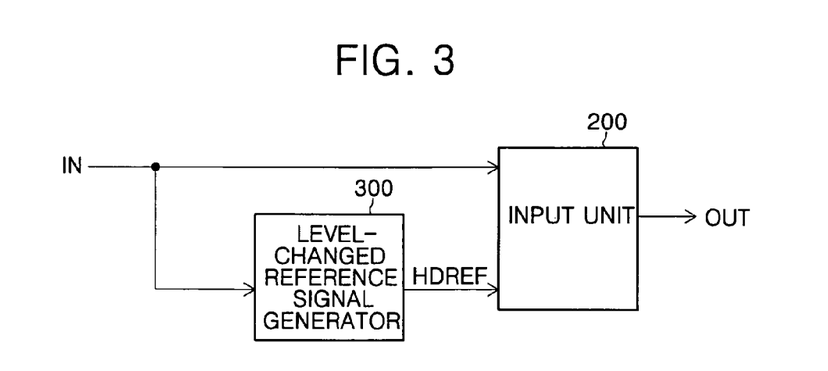
FIG. 3 is a block diagram of an embodiment of an input circuit.

FIG. 3 is a block diagram of an embodiment of an input circuit. Referring to FIG. 3, the input circuit includes an input unit 200 and a variable reference level generator 300. In FIG. 3, IN denotes an input signal, HDREF denotes a reference signal generated by generator 300, and OUT denotes a signal output from unit 200.

The blocks shown in FIG. 3 operate as follows.

The variable reference level generator 300 generates the variable reference level signal HDREF to the input signal IN. That is, the variable reference level generator 300 outputs the reference signal HDREF with a level that varies according to an input signal IN. The level of the reference signal HDREF is lowered in proportion to a time lapse if an input signal IN transits from a high level to a low level and is raised in proportion to a time lapse if the input signal IN transits from a low level to a high level.

The input unit 200 compares the reference signal HDREF with the input signal IN, determines whether the input signal IN is at a logic high or low level responsive to the comparison, and outputs an output signal OUT based on the result. The input unit 200 senses a voltage difference between the reference signal HDREF and the input signal IN and outputs the output signal OUT based on the voltage difference. Alternatively, the input unit 200 senses a current difference between the reference signal HDREF and the input signal IN and outputs the output signal OUT based on the current difference.

When the input signal IN has been maintained at a low level for a time, even if the input signal IN-O is changed to a high level, the input signal IN cannot be raised to a sufficiently high level. In this case, the level of the reference signal HDREF is reduced. On the contrary, when the input signal IN has been maintained at a high level for a time, even if the input signal IN-O is changed to a low level, the input signal IN cannot be lowered to a sufficiently low level. Thus, the level of the reference signal HDREF is increased. By dynamically varying the reference signal HDREF, the difference between the input signal IN and the reference signal HDREF is made larger than in prior input circuits.

Figure 4:
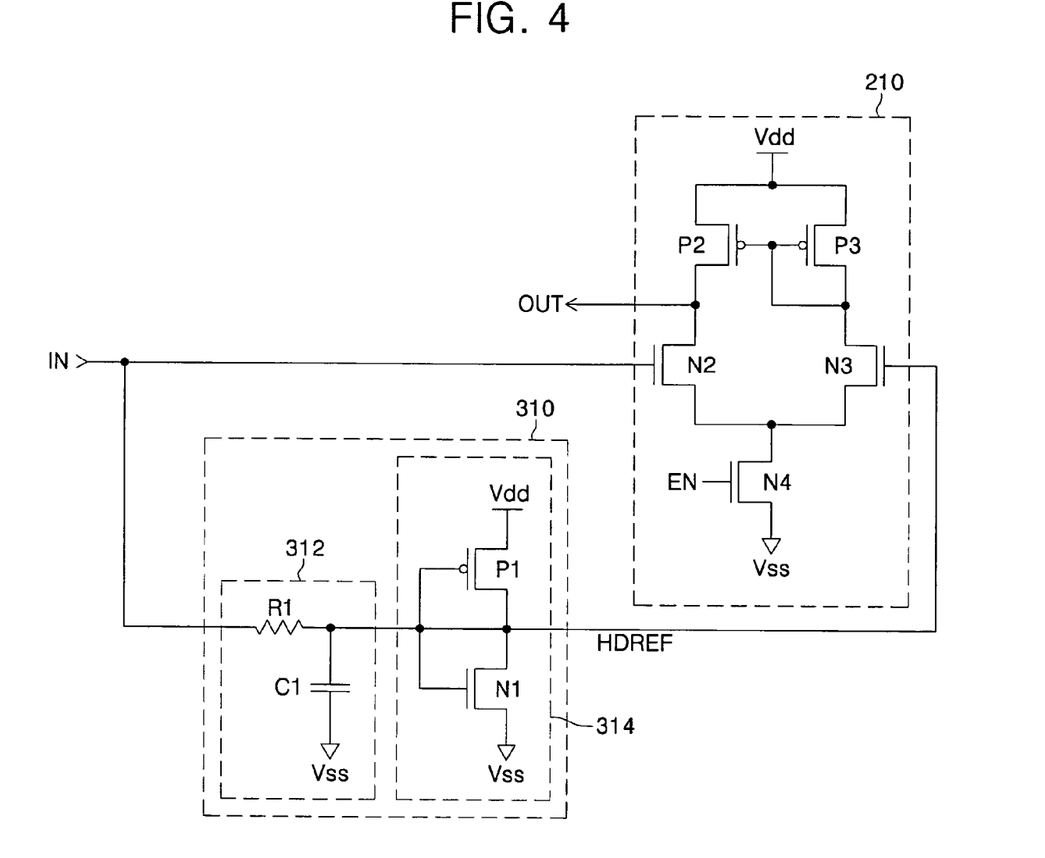
FIG. 4 is a schematic of an embodiment of an input circuit.

FIG. 4 is a schematic diagram of an embodiment of an input circuit. Referring to FIG. 4, the input circuit includes a variable reference level generator 310 and an input unit 210. The variable reference level generator 310 includes a converter 312 and a limiter 314.

The converter 312 includes a resistor R1 coupled between an input terminal receiving an input signal IN and an output terminal outputting a reference signal HDREF. A capacitor C1 is coupled between the output terminal and a low-voltage power supply Vss. The limiter 314 includes a PMOS transistor P1 coupled between a high-voltage power supply Vdd and the output terminal, and an NMOS transistor N1 coupled between the output terminal and the low-voltage power supply Vss. The input unit 210 acts as a differential amplifier using a current mirror, comprised of two PMOS transistors P2 and P3 and three NMOS transistors N2, N3, and N4.

In FIG. 4, the capacitor C1 is coupled between the output terminal outputting the reference signal HDREF and the low-voltage power supply Vss. However, it is possible that the capacitor C1 can be coupled between the output terminal outputting the reference signal HDREF and the high-voltage power supply Vdd. And the converter 312 may include another capacitor coupled between the high-voltage power supply Vdd and the output terminal (not shown).

The blocks shown in FIG. 4 operate as follows.

The variable reference level generator 310 outputs a reference signal HDREF with a level that varies according to an input signal IN. The converter 312 operates as a low pass filter and varies the level of the reference signal HDREF responsive to the input signal IN. That is, the converter 312 makes the level transition of the reference signal HDREF conform to the level transition of the input signal IN according to a certain time constant, determined by the resistor R1 and the capacitor C1.

The limiter 314 limits the level transition of the reference signal HDREF to within a predetermined range. That is, the limiter 314 limits the maximum level of the reference signal HDREF to a predetermined first level and limits the minimum level of the reference signal HDREF to a predetermined second level.

The input unit 210 compares the level of the reference signal HDREF with the level of the input signal IN, determines whether the input signal IN is at a logic low or high level, and outputs a signal OUT based on the comparison.

The input circuit shown in FIG. 4 operates as follows.

The converter 312 operates as the low pass filter. The reference signal HDREF echoes the input signal IN according to a predetermined time constant. As the reference signal HDREF is activated to a higher level, a larger current passes through the NMOS transistor N1 than through the PMOS transistor P1. When the reference signal HDREF reaches a level higher than a predetermined maximum value, the NMOS transistor N1 consumes current. Accordingly, the highest level that the reference signal HDREF reaches is limited to the predetermined maximum value.

In contrast, as the reference signal HDREF is deactivated to a lower level, a larger current passes through the PMOS transistor P1 than through the NMOS transistor N1. That is, when the reference signal HDREF reaches a level lower than a predetermined minimum value, the PMOS transistor P1 supplies current. Accordingly, the lowest level that the reference signal HDREF reaches is limited to the predetermined minimum value.

The input unit 210 operates as a differential amplifier using the current mirror. Specifically, the same current passes through the two PMOS transistors P2 and P3 according to the reference signal HDREF. As the level input signal IN decreases, the resistance of the NMOS transistor N2 increases. As a result, the level of the output signal OUT increases. In contrast, as the level of the input signal IN increases, the resistance of the NMOS transistor N2 decreases. As a result, the level of the output signal OUT decreases. A variation in the level of the output signal OUT becomes larger than a variation in the level of the input signal IN because of the operating characteristics of the NMOS transistor N2. A range within which the level of the output signal OUT is increased or reduced is proportional to a difference in voltage level between the reference signal HDREF and the input signal IN. The input unit 210 shown in FIG. 4 operates as a voltage sense amplifier sensing a voltage difference between the reference signal HDREF and the input signal IN and amplifying that voltage difference.

An enable signal EN applied to a gate of the NMOS transistor N4 may be a signal having an appropriate level higher than a threshold voltage that can turn on the high-voltage power supply Vdd or the NMOS transistor N4.

Figure 5:
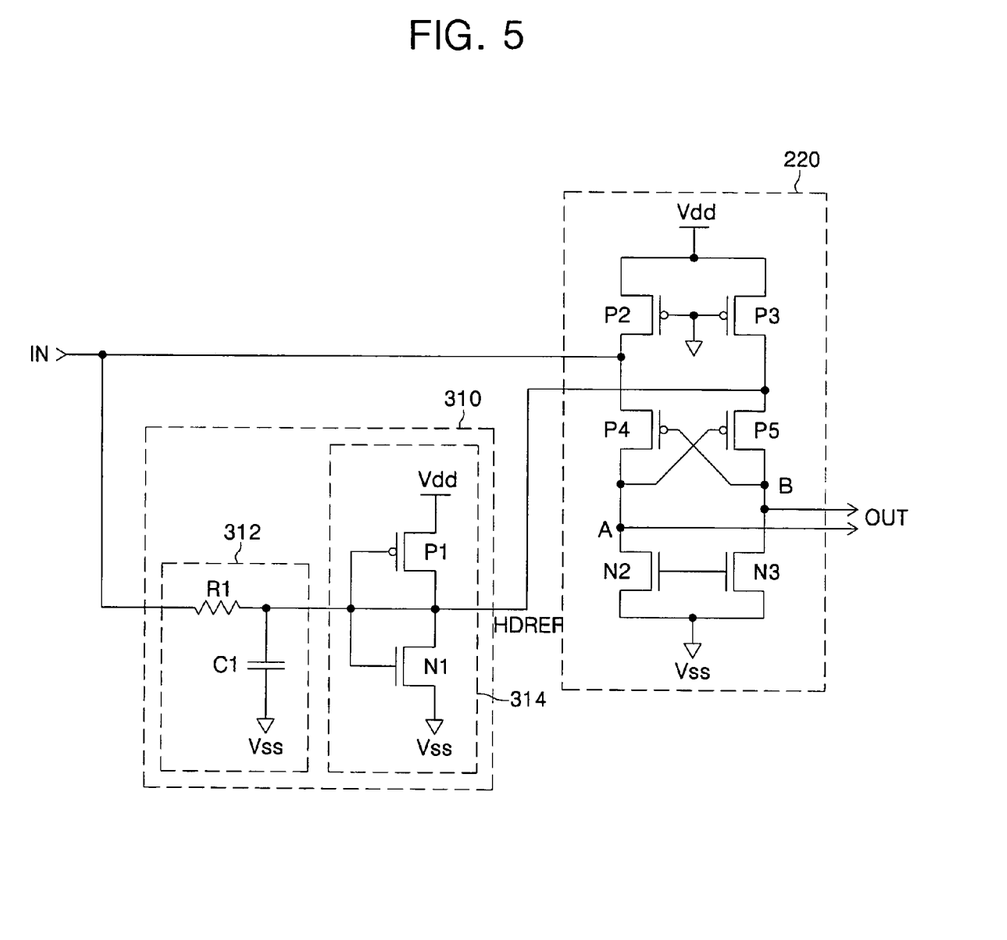
FIG. 5 is a schematic of an embodiment of an input circuit.

FIG. 5 is a schematic diagram of an embodiment of an input circuit. Referring to FIG. 5, the input circuit is similar to the input circuit shown in FIG. 4 except that an input unit 220 comprises four PMOS transistors P2, P3, P4, and P5 and two NMOS transistors N2 and N3 collectively operating as a current sense amplifier.

The blocks shown in FIG. 5 operate similarly to the blocks described with reference to FIG. 4. The operation of a reference level generator 310 is also the same as described with reference to FIG. 4.

The input unit 220 operates as follows.

The two PMOS transistors P2 and P3 pass the same current through both paths. If an input signal IN is at a higher level than a reference signal HDREF, a larger current flows through a line to which the input signal 1N is applied than through a line to which the reference signal HDREF is applied. Thus, a larger current flows through the PMOS transistor P4 than through the PMOS transistor P5. Also, since the two NMOS transistors N2 and N3 output the same current, a higher voltage is applied to a node A than a node B. When the voltage applied to the node A increases, a far smaller current flows through the PMOS transistor P5, and thus the voltage applied to the node B becomes lower. The low voltage applied to the node B leads a larger current to flow through the PMOS transistor P4 so that a far higher voltage is applied to the node A. The input unit 220 outputs voltages applied to the nodes A and B as an output signal OUT. The input unit 220 shown in FIG. 5 operates as the current sense amplifier that amplifies a difference between current caused by the input signal IN and current caused by the reference signal HDREF and outputs an output signal based on the difference.

Figure 6:
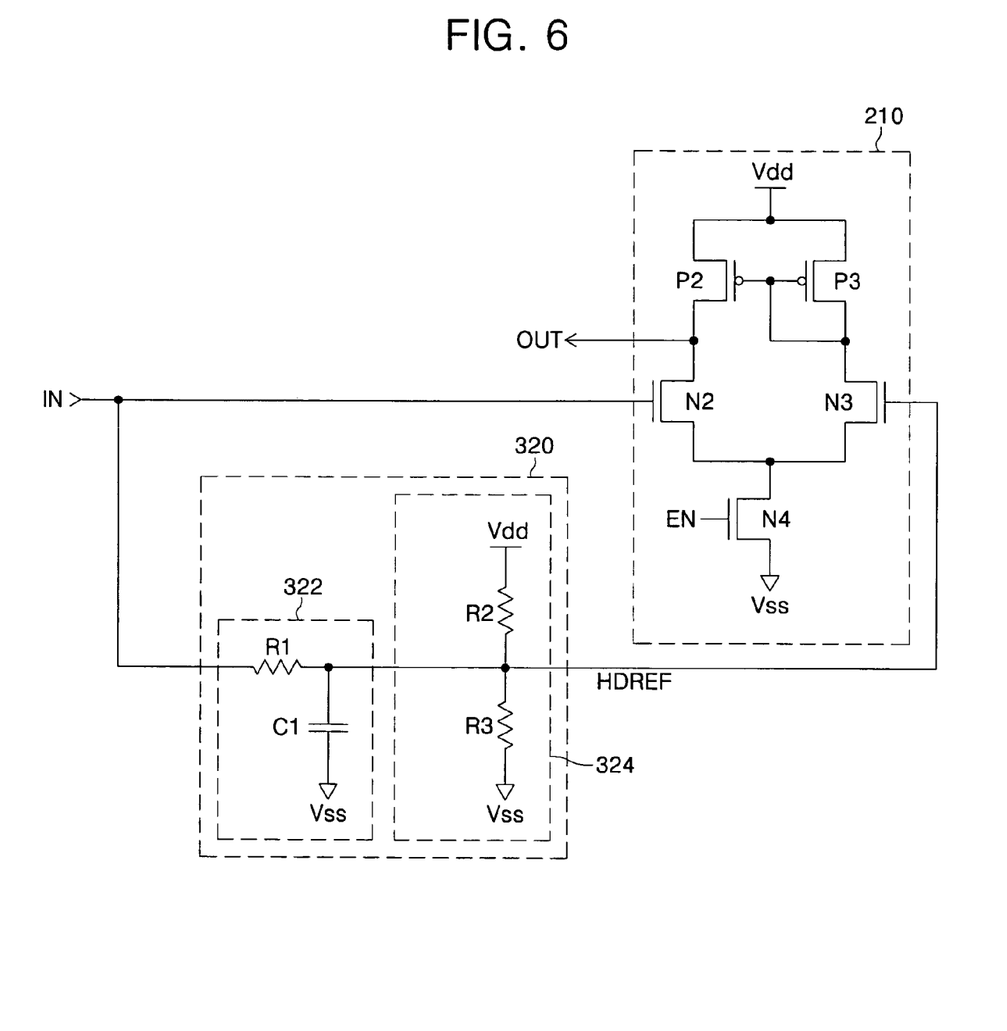
FIG. 6 is a schematic of an embodiment of an input circuit.

FIG. 6 is a schematic diagram of an embodiment of an input circuit. Referring to FIG. 6, the input circuit is similar to the input circuit shown in FIG. 4 except that a limiter 324 of a variable reference level generator 320 includes two resistors R2 and R3.

The blocks shown in FIG. 6 operate similarly to the blocks described with reference to FIG. 4. The operation of a converter 322 and an input unit 210 are the same as that described with reference to FIG. 4.

The limiter 324 of the variable reference level generator 320 according to the present embodiment operates as follows.

Although not shown in the drawings, an output terminal of a circuit from which an input signal IN is output is typically comprised of a buffer, which has a pull-up resistor coupled to a high-voltage power supply and a pull-down resistor coupled to a low-voltage power supply. When the input signal IN is at a high level, the maximum level of a reference signal HDREF is limited to a value obtained by dividing the voltage of a high-voltage power supply Vdd by the total resistance of the pull-up resistor and the resistor R2 of the limiter 324 connected in parallel plus the resistance of the resistor R3 of the limiter 324. And when the input signal IN is at a low level, the minimum level of the reference signal HDREF is limited to a value obtained by dividing the voltage of a high-voltage power supply Vdd by the total resistance of the resistor R2 of the limiter 324 plus the resistance of the pull-down resistor and the resistor R3 of the limiter 324 connected in parallel.

Figure 7:
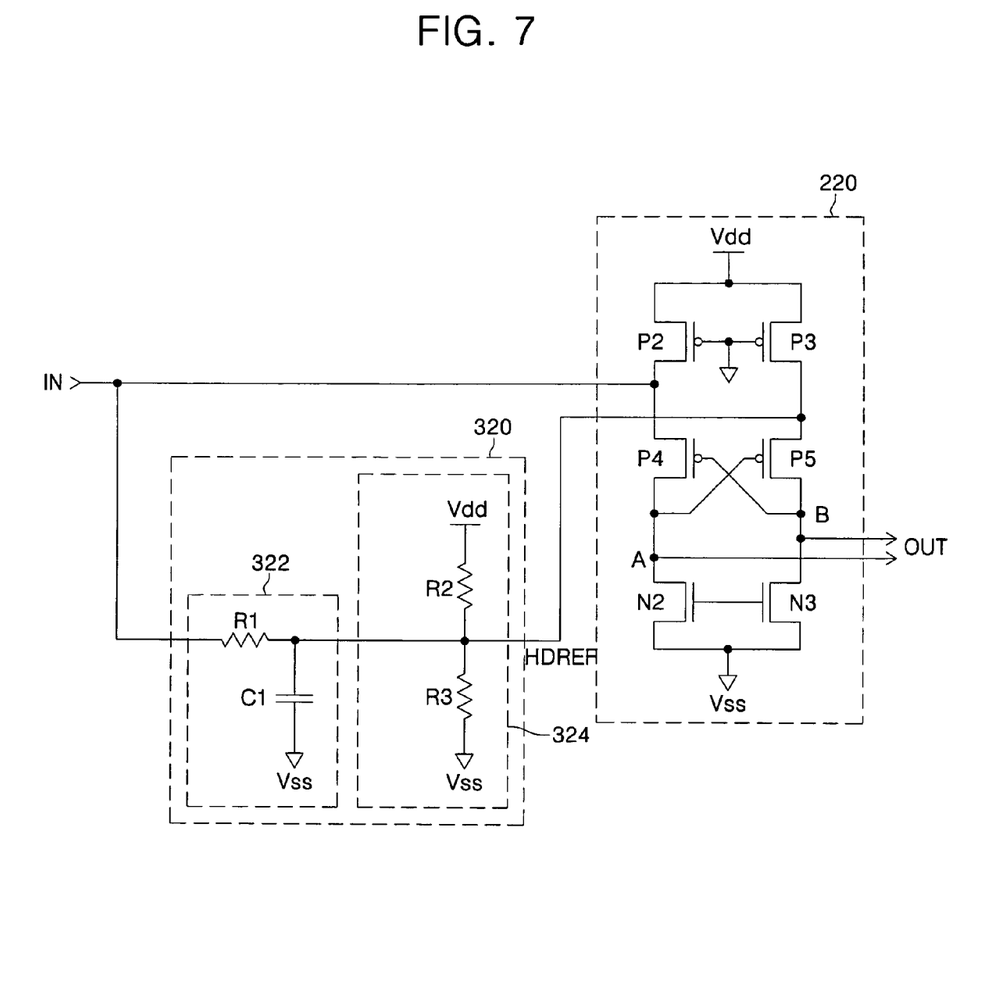
FIG. 7 is a schematic of an embodiment of an input circuit.

FIG. 7 is a schematic diagram of an embodiment of an input circuit. Referring to FIG. 7, the input circuit is similar to the input circuit shown in FIG. 6 except that an input unit 220 acts as a current sense amplifier comprised of four PMOS transistors P2, P3, P4, and P5, and two NMOS transistors N2 and N3.

The blocks shown in FIG. 7 operate similarly as described with reference to FIG. 4.

And the operation of a variable reference level generator 320 is the same as that described with reference to FIGS. 4 and 6. The operation of the input unit 220 is the same as that described with reference to FIG. 5.

Figure 8A:
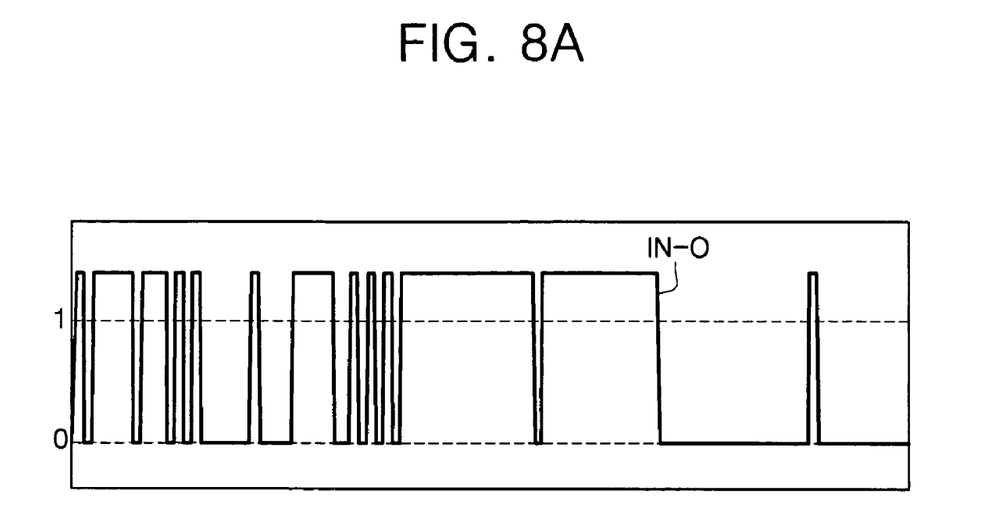
FIGS. 8A and 8B are signal waveform diagrams illustrating the operation of an embodiment of the input circuit.
Figure 8B:
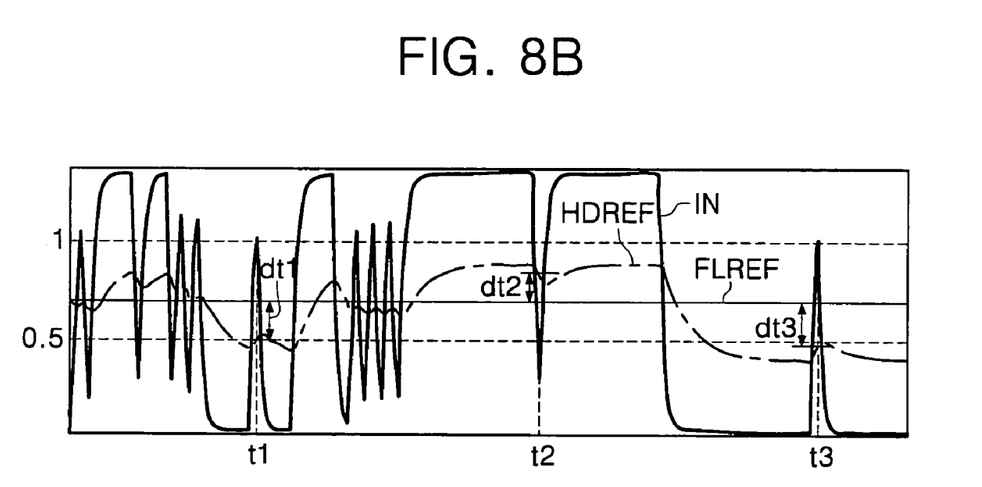

FIGS. 8A and 8B are signal waveform diagrams showing results of a simulation of the input circuit shown in FIG. 4. Specifically, FIG. 8A shows a waveform of an original input signal IN-O, and FIG. 8B shows a waveform of an input signal IN seen from the input unit 200. In FIG. 8B, HDREF denotes a reference signal of the input circuit of the present invention as shown in FIG. 4, and FLREF denotes a reference signal of a conventional input circuit.

We will compare the input circuit shown in FIGS. 1A and 1B with the input circuit shown in FIGS. 4 to 7. The results are shown in FIGS. 8A and 8B.

As described above, the original input signal IN-O is distorted while it is being applied through a signal line. The distortion of the original input signal IN-O becomes more severe as the frequency of the original input signal IN-O and the operation speed of the semiconductor device increase. Therefore, when the original input signal IN-O shown in FIG. 8A is input to the input circuit, it is slightly distorted and looks like the input signal IN shown in FIG. 8B.

Referring to FIG. 8B, at t1 and t3 where the original input signal IN-O maintained at a low level for a predetermined time interval or more is changed to a high level, or at t2 where the original input signal IN-O maintained at a high level for a predetermined time interval or more is changed to a low level, the input signal IN cannot be changed to a sufficiently high level or a sufficiently low level.

Since the conventional input circuit employs a fixed reference signal FLREF, a difference between the reference signal FLREF and the input signal IN is greatly reduced at t1, t2, and t3 as shown in FIG. 8B. This reduced difference makes it difficult to determine whether the input signal IN is at a logic low or high level.

However, the input circuit of the present invention varies the level of a reference signal HDREF according to an input signal IN. Thus, the reference signal HDREF makes a level transition as shown in FIG. 8B. Therefore, it can be observed that a difference between the reference signal HDREF and the input signal IN was increased to dt1, dt2, and dt3 more than in the conventional input circuit at t1, t2, and t3, respectively. The result is that it becomes easier to determine whether the input signal IN is at a logic low or high level.

In other words, in the input circuit of the present invention, when a previous input signal IN is maintained at a low level for a long time, the level of the reference signal HDREF is reduced, and when the previous input signal IN is maintained at a high level for a long time, the level of the reference signal HDREF is increased. Accordingly, a difference between the input signal IN and the reference signal HDREF can be widened in the worst case where a difference therebetween is remarkably reduced. This makes it easier to determine whether the input signal IN is at a logic high or low level.

The input circuit of the present invention can be applied to not only an input terminal of a semiconductor device but also an input terminal of any circuit within a semiconductor device that receives signals produced by other circuits.

As described above, the input circuit and method according to the present invention can widen the minimum difference between an input signal and a reference signal to facilitate analysis of the input signal.

We have described exemplary embodiments in detail. It will be apparent to those of ordinary skill in the art that a wide range of modifications to various aspects of the described embodiments can be made without departing from the spirit and scope of the present as defined in the accompanying claims.

We claim the following:

1. An input circuit comprising:
    a variable reference level generator that increases a level of a variable voltage reference signal in proportion to and in response to a lapse of time when an input signal transits from a low level to a high level, and to decrease the level of the variable voltage reference signal in proportion to and in response to another lapse of time when the input signal transits from a high level to a low level; and
    an analyzer that compares a level of the input signal with the level of the variable voltage reference signal, determines the level of the input signal, and outputs an output signal based on the result of the determination.

2. The input circuit of claim 1 where the variable reference level generator includes:
    a converter to generate the variable voltage reference signal responsive to the input signal; and
    a limiter to limit a level swing of the variable voltage reference signal to a predetermined range.

3. The input circuit of claim 2 where the converter includes a filter to filter the input signal.

4. The input circuit of claim 2 where the converter includes:
    a resistor to receive the input signal at one end; and
    a capacitor coupled between another end of the resistor and a voltage source.

5. The input circuit of claim 2 where the converter includes:
    a resistor to receive the input signal at one end;
    a first capacitor coupled between another end of the resistor and a first voltage source; and
    a second capacitor coupled between the another end of the resistor and a second voltage source.

6. The input circuit of claim 2 where the limiter includes:
    a high level limiting unit to limit a high level of the variable voltage reference signal by consuming current when the level of the variable voltage reference signal rises above a predetermined maximum value; and
    a low level limiting unit to limit a low level of the variable voltage reference signal by supplying current when the level of the variable voltage reference signal drops below a predetermined minimum value.

7. The input circuit of claim 6 where the high level limiting unit includes an NMOS transistor coupled to a low voltage power supply and a gate to receive the variable voltage reference signal.

8. The input circuit of claim 6 where the low level limiting unit includes a PMOS transistor coupled to a high voltage power supply and a gate to receive the variable voltage reference signal.

9. The input circuit of claim 6 where the limiter includes:
    a first resistor adapted to be coupled to a high voltage power supply at a first end of the first resistor; and
    a second resistor adapted to be coupled to a second end of the first resistor and to a low voltage power supply at a third end.

10. The input circuit of claim 1 where the analyzer is a voltage sense amplifier adapted to sense a voltage difference between the input signal and the variable voltage reference signal, to amplify the voltage difference, and to output the output signal.

11. The input circuit of claim 1 where the analyzer is a current sense amplifier adapted to sense a current difference between the input signal and the variable voltage reference signal, to amplify the current difference, and to output the output signal.

12. A method comprising:
    generating a variable voltage reference signal;
    increasing a level of the variable voltage reference signal in proportion to and in response to a time when an input signal transits from a low level to a high level;
    decreasing the level of the variable voltage reference signal in proportion to and in response to another time when the input signal transits from a high level to a low level;

comparing the input signal with the variable voltage reference signal; and generating an output signal responsive to the comparing.

13. The method of claim 12 where comparing includes comparing a level of the input signal with the level of the variable voltage reference signal.

14. The method of claim 12 where generating the variable voltage reference signal includes:

varying the level of the variable voltage reference signal according to the input signal; and limiting the level of the variable voltage reference signal to within a predetermined range.

15. The method of claim 14 where the limiting includes:

consuming current to limit a highest level of the variable voltage reference signal when the level of the variable voltage reference signal rises above a predetermined maximum value; and supplying current to limit a lowest level of the variable voltage reference signal when the level of the variable voltage reference signal drops below a predetermined minimum value.

16. The method of claim 14 where comparing includes determining a level of the input signal by sensing a voltage difference between the variable voltage reference signal and the input signal.

17. The method of claim 12 where comparing includes determining a level of the input signal by sensing a current difference between the variable voltage reference signal and the input signal.

* * * * *

UNITED STATES PATENT AND TRADEMARK OFFICE
CERTIFICATE OF CORRECTION

PATENT NO. : 7,471,108 B2
APPLICATION NO. : 11/298201
DATED : December 30, 2008
INVENTOR(S) : In-Chul Jeong

Page 1 of 1

It is certified that error appears in the above-identified patent and that said Letters Patent is hereby corrected as shown below:

Column 6, line 9, the word "1N" should read -- IN --;
Column 7, line 63, the words "that increases" should read -- to increase --;
Column 8, line 4, the words "that compares" should read -- to compare --;
Column 8, lines 5-6, the word "determines" should read -- to determine --;
Column 8, line 6, the word "outputs" should read -- to output --;
Column 10, line 7, the words "claim 14" should read -- claim 12 --.

Signed and Sealed this

Fifteenth Day of December, 2009

David J. Kappos
*Director of the United States Patent and Trademark Office*